(12) United States Patent
Kawada

(10) Patent No.: US 12,550,368 B2
(45) Date of Patent: Feb. 10, 2026

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Yasuyuki Kawada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 590 days.

(21) Appl. No.: 17/727,106

(22) Filed: Apr. 22, 2022

(65) Prior Publication Data

US 2022/0406931 A1    Dec. 22, 2022

(30) Foreign Application Priority Data

Jun. 21, 2021 (JP) .................. 2021-102718

(51) Int. Cl.
*H10D 12/01* (2025.01)
*H01L 21/04* (2006.01)
(Continued)

(52) U.S. Cl.
CPC ......... *H10D 30/668* (2025.01); *H01L 21/049* (2013.01); *H10D 12/031* (2025.01); *H10D 62/8325* (2025.01); *H10D 64/516* (2025.01)

(58) Field of Classification Search
None
See application file for complete search history.

(56) References Cited

U.S. PATENT DOCUMENTS

2012/0009801 A1    1/2012    Tanioka et al.
2015/0021623 A1*   1/2015    Lichtenwalner ...... H01L 21/045
                                                           257/77
(Continued)

FOREIGN PATENT DOCUMENTS

JP    2012039127 A    2/2012
JP    2018060923 A    4/2018
JP    6729824 B1      7/2020

OTHER PUBLICATIONS

Japanese Office Action dated Feb. 25, 2025, in the counterpart Japanese Patent Application No. 2021-102718.

*Primary Examiner* — Kretelia Graham
*Assistant Examiner* — William Henry Anderson
(74) *Attorney, Agent, or Firm* — Rabin & Berdo, P.C.

(57) ABSTRACT

A bottom of a trench is an Si plane or a C plane while sidewalls of the trench are an m-plane. In the trench, a gate electrode is provided via a gate insulating film. The gate insulating film is a HTO film with a thickness of at least 50 nm. By a post-HTO-deposition annealing at a temperature in a range of 1250 degrees C. to 1300 degrees C. under a mixed gas atmosphere containing nitric oxide, nitrogen, and oxygen, the film density of the gate insulating film is within a range of 2.21 g/cm$^3$ to 2.38 g/cm$^3$. The total oxygen flow amount of the mixed gas atmosphere of the post-HTO-deposition annealing is at most 5%. The gate insulating film has a two-layer structure including a low-density film that is within 3 nm from a SiC/SiO$_2$ interface and has a relatively low film density, and a high-density film that is at least 3 nm apart from the SiC/SiO$_2$ interface and has a relatively high film density.

12 Claims, 6 Drawing Sheets

(51) Int. Cl.
*H10D 30/66* (2025.01)
*H10D 62/832* (2025.01)
*H10D 64/27* (2025.01)

(56) References Cited

U.S. PATENT DOCUMENTS

| | | | |
|---|---|---|---|
| 2016/0005826 A1* | 1/2016 | Uchida | H10D 30/63 |
| | | | 438/589 |
| 2016/0322489 A1* | 11/2016 | Siemieniec | H01L 29/513 |
| 2018/0097079 A1 | 4/2018 | Utsumi et al. | |
| 2021/0134961 A1* | 5/2021 | Utsumi | H10D 62/107 |
| 2021/0234005 A1 | 7/2021 | Kawada | |
| 2021/0296128 A1* | 9/2021 | Shimizu | H10D 30/66 |
| 2021/0296446 A1* | 9/2021 | Shimizu | H10D 62/8325 |
| 2022/0005925 A1* | 1/2022 | Shimizu | H01L 21/0465 |
| 2022/0013641 A1* | 1/2022 | Kawada | H10D 30/668 |

* cited by examiner

FIG.4

| CRYSTAL PLANE ORIENTATION | HTO FILM THICKNESS=26nm | HTO FILM THICKNESS=53nm |
|---|---|---|
| Si PLANE | 2.24 g/cm$^3$ | 2.32 g/cm$^3$ |
| C PLANE | 2.30 g/cm$^3$ | 2.34 g/cm$^3$ |
| m PLANE | 2.17 g/cm$^3$ | 2.24 g/cm$^3$ |

FIG.5

| CRYSTAL PLANE ORIENTATION | WITHIN 3nm FROM SiC/SiO$_2$ INTERFACE | 3nm OR MORE FROM SiC/SiO$_2$ INTERFACE |
|---|---|---|
| Si PLANE | 2.25 g/cm$^3$ | 2.32 g/cm$^3$ |
| C PLANE | 2.35 g/cm$^3$ | 2.37 g/cm$^3$ |
| m PLANE | 2.17 g/cm$^3$ | 2.24 g/cm$^3$ |

FIG.6

| | FILM DENSITY |
|---|---|
| REFERENCE EXAMPLE (NO POST-HTO ANNEALING) | 2.24 g/cm$^3$ |
| CONVENTIONAL EXAMPLE (POST-HTO ANNEALING IN 10%NO/N$_2$ GAS ATMOSPHERE) | 2.29 g/cm$^3$ |
| COMPARISON EXAMPLE (POST-HTO ANNEALING IN 5%O$_2$/N$_2$ GAS ATMOSPHERE) | 2.30 g/cm$^3$ |
| EXAMPLE (POST-HTO ANNEALING IN 6%NO/2%O$_2$/N$_2$ GAS ATMOSPHERE) | 2.35 g/cm$^3$ |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-102718, filed on Jun. 21, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, in a trench-gate-type SiC-MOSFET (metal oxide semiconductor field effect transistor having an insulated gate with a 3-layer structure including a gate, an oxide film, and a semiconductor) having silicon carbide (SiC) as a semiconductor material, a silicon oxide ($SiO_2$) film (hereinafter, HTO film) deposited by a high-temperature oxidation process (HTO process) such as that for a high temperature oxide (HTO) is often used as a gate insulating film. A reason for this is as follows.

In a SiC-MOSFET, film quality of the gate insulating film affects device element characteristics and reliability. While a $SiO_2$ film formed by thermal oxidation (hereinafter, thermal oxide film) is superior to a HTO film as a $SiO_2$ film, the semiconductor substrate, which contains SiC, is thermally oxidized and due to this thermal oxidation reaction, excess carbon (C) is generated at a junction interface between the semiconductor substrate and the gate insulating film (hereinafter, $SiC/SiO_2$ interface). This excess carbon adversely affects interface characteristics of the $SiC/SiO_2$ interface (increases of interface state, defects in the $SiO_2$, etc.) and causes degradation of device element characteristics.

To suppress the generation of excess carbon, the gate insulating film is often formed by deposition instead of thermal oxidation. Further, it is desirable for the gate insulating film to have good film quality with a high film density and high denseness. In an instance of a trench gate structure, it is desirable for the gate insulating film to be formed sufficiently thick even on the bottom of the trench. From these points, as a gate insulating film of a trench gate structure, a HTO film (a $SiO_2$ film deposited by a high-temperature oxidation process) having relatively good film quality and formed having a relatively uniform thickness within a plane of the inner wall of the trench is used.

As a method of forming the gate insulating film, a method has been proposed in which oxygen is obliquely ion-implanted through an oxide film mask constituting a screen oxide film, thereby forming an oxygen ion implanted layer in a surface region of a sidewall of the trench and after the oxide film mask is removed, a HTO film constituting a gate insulating film is formed (for example, refer to Japanese Patent No. 6729824). In Japanese Patent No. 6729824, excess carbon occurring in early stages of the deposition of the HTO film and excess carbon in the gate insulating film react with the oxygen in the oxygen ion implanted layer, form carbon dioxide and are released, whereby the generation of excess carbon is suppressed compared to an instance in which the gate insulating film is formed by thermal oxidation.

SUMMARY OF THE INVENTION

According to an embodiment of the invention, a silicon carbide semiconductor device has an insulated gate with a three-layer structure including a gate, an oxide film, and a semiconductor, the silicon carbide semiconductor device includes: a semiconductor substrate containing silicon carbide and constituting the semiconductor, the semiconductor substrate having a main surface; a trench extending a predetermined depth from the main surface of the semiconductor substrate, in a direction orthogonal to the main surface of the semiconductor substrate, the trench having an inner wall that includes a sidewall and a bottom of the trench; a gate insulating film constituting the oxide film, provided along the inner wall of the trench, the gate insulating film being in contact with the semiconductor substrate at the inner wall of the trench; and a gate electrode constituting the gate, provided on the gate insulating film in the trench. A trench gate structure is formed in which a channel is formed in a portion of the semiconductor substrate along the sidewall of the trench when the silicon carbide semiconductor device is on. The main surface of the semiconductor substrate is an Si plane ((0001) plane). The sidewall of the trench is an m-plane. The gate insulating film is a silicon oxide film having a thickness of at least 50 nm, and is a high-temperature oxidation film. The gate insulating film has a film density that is in a range of 2.21 $g/cm^3$ to 2.38 $g/cm^3$, and has a bottom portion disposed at the bottom of the trench and a sidewall portion disposed at the sidewall of the trench, a film density of the bottom portion being higher than a film density of the sidewall portion.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a table depicting a relationship between a thickness and a film density of a HTO film in experimental examples.

FIG. 5 is a table depicting a relationship between the film density and a distance from a $SiC/SiO_2$ interface of the HTO film in the experimental examples.

FIG. 6 is a table depicting a relationship between the film density of the HTO film and post-HTO-deposition annealing conditions.

DETAILED DESCRIPTION OF THE INVENTION

Figure 1:
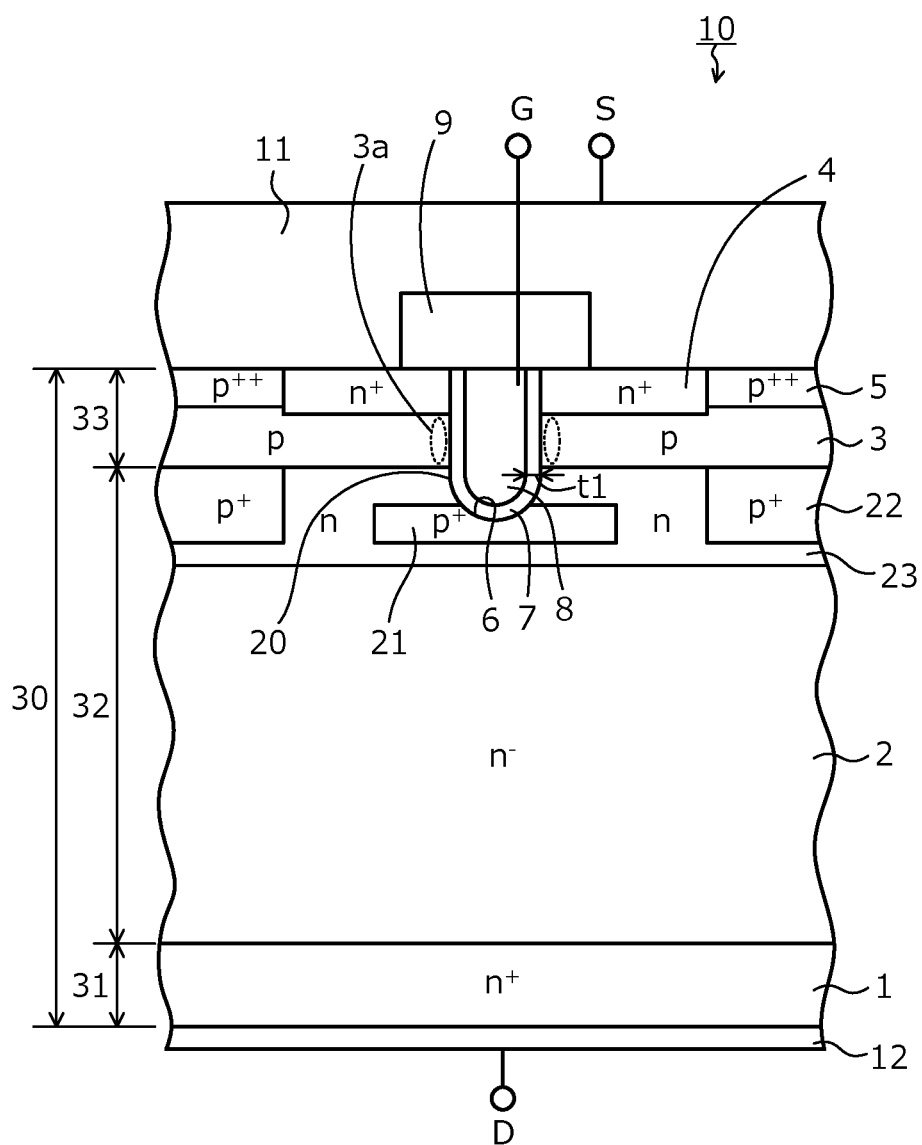
FIG. 1 is a cross-sectional view of a structure of a silicon carbide semiconductor device according to an embodiment.

First, problems associated with the conventional techniques are discussed. Normally, during operation of a trench-gate-type MOSFET, electric field concentrates near the bottom of the trench and therefore, it is desirable for a portion of the gate insulating film on the trench bottom to be thicker than the portions of the gate insulating film on the trench sidewalls. Nonetheless, the thickness of a HTO film deposited along the inner wall of the trench by general high-temperature oxidation process tends to be slightly thinner at the portion on the trench bottom than at the portions on the trench sidewalls. Further, the HTO film is less dense and has poor insulating performance compared to a thermal oxide film. Thus, the reliability of the MOSFET decreases and the lifespan (service life) of the MOSFET may be shortened.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
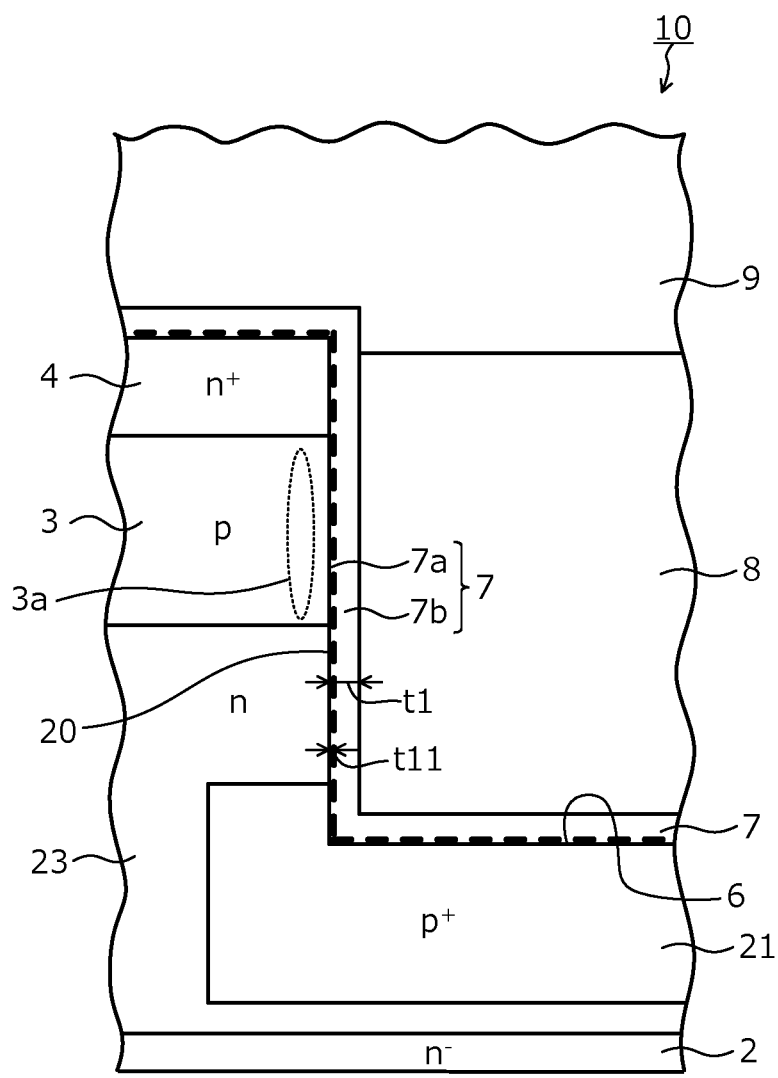
FIG. 2 is an enlarged view schematically depicting a vicinity of a trench in FIG. 1.

A structure of a silicon carbide semiconductor device according to an embodiment is described. FIG. 1 is a cross-sectional view of the structure of the silicon carbide semiconductor device according to the embodiment. FIG. 2 is an enlarged view schematically depicting a vicinity of a trench in FIG. 1. A silicon carbide semiconductor device 10 according to the embodiment depicted in FIG. 1 is a vertical MOSFET having a trench gate structure in a semiconductor substrate (semiconductor chip) 30, at a front surface of the semiconductor substrate 30 that contains silicon carbide (SiC) as a semiconductor material. The semiconductor substrate 30 is an epitaxial substrate in which epitaxial layers 32, 33 respectively constituting an n$^-$-type drift region 2 and a p-type base region 3 are sequentially stacked on a front surface of an n$^+$-type starting substrate 31 containing SiC as a semiconductor material.

The semiconductor substrate 30 has, as the front surface (main surface), a main surface with the p-type epitaxial layer 33 and, as a back surface, a main surface having the n$^+$-type starting substrate 31. The semiconductor substrate 30 has a crystal structure that is, for example, a silicon carbide four-layer periodic hexagonal crystal structure (4H—SiC). The front surface of the semiconductor substrate 30 is a (0001) plane, a so-called Si (silicon) plane or a (000-1) plane, a so-called C (carbon) plane. The n$^+$-type starting substrate 31 is an n$^+$-type drain region 1. The n$^-$-type drift region 2 is a portion of the n$^-$-type epitaxial layer 32, facing the n$^+$-type starting substrate 31 and adjacent to the n$^+$-type starting substrate 31. The p-type base region 3 is provided between the front surface of the semiconductor substrate 30 and the n$^-$-type drift region 2.

The trench gate structure is configured by the p-type base region 3, n$^+$-type source regions 4, p$^{++}$-type contact regions 5, trenches 6, a gate insulating film 7, and gate electrodes 8. Between the p-type base region 3 and the n$^-$-type drift region 2, at a position closer to the n$^+$-type drain region 1 than are bottoms of the trenches 6, an n-type current spreading region 23 and the p$^+$-type regions 21, 22 are selectively provided. The n-type current spreading region 23 and the p$^+$-type regions 21, 22 are diffused regions formed in the n$^-$-type epitaxial layer 32 by ion implantation. A portion of the n$^-$-type epitaxial layer 32 other than the n-type current spreading region 23 and the p$^+$-type regions 21, 22 constitutes the n$^-$-type drift region 2.

The n-type current spreading region 23 is a so-called current spreading layer (CSL) that reduces carrier spreading resistance. The n-type current spreading region 23 is in contact with the p-type base region 3 and the n$^-$-type drift region 2 in a depth direction between adjacent trenches of the trenches 6, the n-type current spreading region 23 reaching the trenches 6 in a direction parallel to the front surface of the semiconductor substrate 30 to be in contact with the gate insulating film 7. The n-type current spreading region 23 may be omitted. In this case, instead of the n-type current spreading region 23, the n$^-$-type drift region 2 reaches the p-type base region 3 from the n$^+$-type drain region 1 and reaches the trenches 6 in a direction parallel to the front surface of the semiconductor substrate 30 to be in contact with the gate insulating film 7.

The p$^+$-type regions 21, 22 are fixed at a potential of a later-described source electrode 11 and have a function of depleting when the MOSFET (the silicon carbide semiconductor device 10) is off (or causing depletion of the n-type current spreading region 23, or both) and mitigating electric field applied to the gate insulating film 7 at the bottoms of the trenches 6. The p$^+$-type regions 21 are provided separate from the p-type base region 3 and face bottoms of the trenches 6 in the depth direction. The p$^+$-type regions 21 are partially connected to the type regions 22 by a non-depicted portion or are connected to another p-type region and are thereby, electrically connected to the source electrode 11. The p$^+$-type regions 21 may be in contact with the gate insulating film 7 at the bottoms of the trenches 6 or may be apart from the bottoms of the trenches 6.

The p$^+$-type regions 21 may further face bottom corner portions of the trenches 6 in the depth direction. The p$^+$-type regions 21 face the bottom corner portions of the trenches 6 in the depth direction, whereby the electric field applied to the gate insulating film 7 at the bottom corner portions of the trenches 6 when the MOSFET is off is mitigated, thereby increasing the effect of mitigating the electric field near the bottoms of the trenches 6. The bottom corner portions of the trenches 6 are connecting portions connecting the bottoms and sidewalls of the trenches 6. In FIG. 2, a state in which the bottom corner portions (corners) of the trenches 6 are rounded is not depicted, however, the connecting portions connecting the bottoms with the sidewalls of the trenches 6 is clarified. The p$^+$-type regions 22 depicted in FIG. 1 are provided between adjacent trenches of the trenches 6, apart from the trenches 6 and the p$^+$-type regions 21. The p$^+$-type regions 22 have surfaces that face the n$^+$-type source regions 4 and that are in contact with the p-type base region 3, the p$^+$-type regions 22 being electrically connected to the source electrode 11 via the p-type base region 3.

The trenches 6 penetrate through the p-type epitaxial layer 33 in the depth direction from the front surface of the semiconductor substrate 30 and reach the n-type current spreading region 23 (in an instance in which the n-type current spreading region 23 is omitted, the n$^-$-type drift region 2). The trenches 6 may terminate in the p$^+$-type regions 21. The trenches 6, for example, extend in a striped pattern in a direction parallel to the front surface of the semiconductor substrate 30 (direction of view in FIG. 1). The n$^+$-type source regions 4 and the p$^{++}$-type contact regions 5 are selectively provided between the front surface of the semiconductor substrate 30 and the p-type base region 3, between adjacent trenches of the trenches 6. The n$^+$-type source regions 4 and the p$^{++}$-type contact regions 5 are diffused regions formed in the p-type epitaxial layer 33 by ion implantation.

The n$^+$-type source regions 4 and the p$^{++}$-type contact regions 5 are exposed at the front surface of the semiconductor substrate 30. Being exposed at the front surface of the semiconductor substrate 30 means being in contact with the later-described source electrode 11, at the front surface of the semiconductor substrate 30. The n$^+$-type source regions 4 are provided closer to the trenches 6 than are the p$^{++}$-type contact regions 5 and are in contact with the gate insulating film 7 at the sidewalls of the trenches 6. The p$^{++}$-type contact regions 5 may be omitted. In this instance, instead of the p$^{++}$-type contact regions 5, the p-type base region 3 reaches and is exposed at the front surface of the semiconductor substrate 30. A portion of the p-type epitaxial layer 33 other than the n$^+$-type source regions 4 and the p$^{++}$-type contact regions 5 constitutes the p-type base region 3.

At the bottoms of the trenches 6, a crystal plane like that of the semiconductor substrate 30 appears. The sidewalls of the trenches 6 are {1-100} planes, so-called m-planes. In the trenches 6, the gate insulating film 7 is provided along the inner walls of the trenches 6. At the inner walls of the trenches 6, the gate insulating film 7 is in contact with the n$^+$-type source regions 4, the p-type base region 3, and the n-type current spreading region 23 (in an instance in which the n-type current spreading region 23 is omitted, the n$^-$-type drift region 2). As described hereinafter, when the MOSFET is on, a channel (n-type inversion layer) is formed in portions 3a of the p-type base region 3, along the sidewalls (i.e., m-plane) of the trenches 6, in a junction interface (the SiC/SiO$_2$ interface) 20 between the semiconductor substrate 30 and the gate insulating film 7.

The gate insulating film 7 is a silicon oxide (SiO$_2$) film (hereinafter, HTO film) deposited by a general HTO process (high-temperature oxidation process). Earnest research by the inventor confirmed that a film density of the HTO film differs depending on the crystal plane that appears at the SiC surface where the HTO film is deposited, and is higher for a Si plane ((0001) plane) and a C plane ((000-1) plane) than for an m-plane ({1-100} plane). Further, a thickness of the HTO film tends to be thinner at the bottoms of the trenches 6 than at the sidewalls of the trenches 6. The greater the thickness of the HTO film is, the higher the film density becomes (refer to later-described FIG. 4) and therefore, when insulating performance is to be increased for the gate insulating film 7, the HTO film has to have a certain amount of thickness. The thickness of a gate insulating film of a general trench-gate-type SiC-MOSFET is, for example, in a range of about 60 nm to 80 nm.

As described above, the bottoms of the trenches 6 are Si planes or C planes, while the sidewalls of the trenches 6 are m-planes and thus, the film density of the gate insulating film 7 is higher at portions on the bottoms (Si plane or C plane) of the trenches 6 that at portions on the sidewalls (m-plane) of the trenches 6. Accordingly, even when a thickness t1 of the gate insulating film 7 deposited by a general HTO process is slightly thinner at portions of the gate insulating film 7 on the bottoms of the trenches 6 than at portions of the gate insulating film 7 on the sidewalls, the film quality of the gate insulating film 7 on the bottoms of the trenches 6 is favorable. Therefore, the bottoms of the trenches 6 are an Si plane or a C plane and the gate insulating film 7 is a HTO film, whereby an effect of mitigating electric field near the bottoms of the trenches 6 increases and various characteristics such as realizing a predetermined breakdown voltage may be ensured.

Further, annealing (hereinafter, post-HTO-deposition annealing, step S5 in FIG. 3) under predetermined conditions described hereinafter is performed after the gate insulating film 7 is deposited, whereby the gate insulating film 7 has favorable film quality and a higher film density compared to that in an instance in which a post-HTO-deposition annealing is performed under conventional conditions (post-HTO-deposition annealing conditions of a conventional example described hereinafter, refer to FIG. 6). In FIG. 6, only the film density of the HTO film (corresponds to the gate insulating film 7) on the m-plane is depicted. While not depicted, the film densities of the HTO film on the Si plane and the C plane are higher than the film density of the HTO film on the m-plane. Due to the post-HTO-deposition annealing under the later-described predetermined conditions, the film density of the gate insulating film 7 on the m-plane becomes a value closer to the film densities of the HTO film on the Si plane and the C plane as compared to before the post-HTO-deposition annealing is performed under the later-described predetermined conditions.

In particular, in a measurement by an X-ray reflectivity (XRR) method, the film density of an entire area of the gate insulating film 7 is, for example, at least 2.24 g/cm$^3$, which is the film density of the HTO film on the m-plane before the post-HTO-deposition annealing. More specifically, in the measurement by the XRR method, the film density of the gate insulating film 7 includes measurement error (±0.03 g/cm$^3$) and, for example, is within a range of 2.21 g/cm$^3$ to 2.38 g/cm$^3$ within a plane of the inner walls of the trenches 6, or preferably, within a plane (m-plane) of the sidewalls of the trenches 6, may be higher than the film density (=2.26 g/cm$^3$) of a HTO film obtained by a post-HTO-deposition annealing performed under the conventional conditions and, for example, may be set to be at least about 2.27 g/cm$^3$ (refer to FIG. 6).

Further, the film density of the gate insulating film 7 may be increased by the post-HTO-deposition annealing performed under the later-described conditions, whereby the thickness t1 of the gate insulating film 7 may be reduced to, for example, about 50 nm on the bottoms of the trenches 6 where the thickness t1 is relatively slightly thinner. The thinner is the thickness t1 of the gate insulating film 7, the greater the voltage (gate voltage) applied to the gate electrodes 8 may be reduced and therefore, from the perspective of reliability and lifespan, it is desirable for the thickness t1 of the gate insulating film 7 to be as thin as possible. In the present embodiment, the thickness t1 of the gate insulating film 7, for example, is at least about 50 nm and may be set to be, for example, at most about 80 nm, which is the same as the thickness of a gate insulating film of a typical trench-gate-type SiC-MOSFET.

Further, the post-HTO-deposition annealing is performed under the later-described predetermined conditions, whereby a nitrogen concentration (nitrogen atom concentration) of nitrogen (N) atoms accumulated (piled up) at the SiC/SiO$_2$ interface 20 is maintained at substantially a same level as that in an instance in which the post-HTO-deposition annealing is performed under the conventional conditions, and a nitrogen concentration (nitrogen atom concentration) in the gate insulating film 7 may be reduced a greater extent than in an instance in which a post-HTO-deposition annealing is performed under the convention conditions (refer to FIG. 8). In particular, the nitrogen concentration of the SiC/SiO$_2$ interface 20, for example, is at least about $5 \times 10^{20}$ atoms/cm$^3$. In the gate insulating film 7, an average nitrogen concentration in a thickness direction from the SiC/SiO$_2$ interface 20 to a contact surface of the gate insulating film 7 in contact with the gate electrodes 8 is, for example, at most about $5 \times 10^{19}$ atoms/cm$^3$.

Further, the gate insulating film 7 has a two-layer structure in which a low-density film 7a having a relatively low film density and a high-density film 7b having a relatively high film density are sequentially stacked (refer to FIG. 2). In FIG. 2, an interface between the low-density film 7a and the high-density film 7b is indicated by a dashed line. In the gate insulating film 7, the low-density film 7a is a portion within a range t11 of 3 nm from the SiC/SiO$_2$ interface 20 and in contact with the semiconductor substrate 30 at the inner walls of the trenches 6. The low-density film 7a is a portion of an initial stage of the deposition of the HTO film constituting the gate insulating film 7 and has poor film quality and a film density that is lower than that of the high-density film 7b (refer to FIG. 5). The high-density film 7b is a portion that is at least 3 nm apart from the SiC/SiO$_2$ interface 20. In the gate insulating film 7, the high-density film 7b is a portion other than the low-density film 7a and is in contact with the low-density film 7a and the gate electrodes 8.

In the trenches 6, the gate electrodes 8 are provided on the gate insulating film 7, so as to be embedded in the trenches 6. In FIG. 1, while only one unit cell (constituent unit of a device element) of the MOSFET is depicted, in the semiconductor substrate 30, multiple unit cells of the same trench gate structure are disposed adjacently. An insulating film 9 is provided on an entire area of the front surface of the semiconductor substrate 30 and covers the gate electrodes 8. The insulating film 9 has contact holes in which the n$^+$-type source regions 4 and the p$^{++}$-type contact regions 5 are exposed. The p$^{++}$-type contact regions 5 may be omitted. In this case, instead of the p$^{++}$-type contact regions 5, portions of the p-type base region 3 reach the front surface of the semiconductor substrate 30 and are exposed in the contact holes of the insulating film 9.

In the contact holes of the insulating film 9, the source electrode 11 forms ohmic junctions with the n$^+$-type source regions 4 and the p$^{++}$-type contact regions 5, and is electrically connected to the n$^+$-type source regions 4, the p$^{++}$-type contact regions 5, and the p-type base region 3. In an instance in which the p$^{++}$-type contact regions 5 are omitted, in the contact holes of the insulating film 9, the source electrode 11 forms ohmic junctions with the p-type base region 3. A drain electrode 12 is provided on an entire area of the back surface (back surface of the n$^+$-type starting substrate 31) of the semiconductor substrate 30. The drain electrode 12 is in contact with the n$^+$-type drain region 1 (the n$^+$-type starting substrate 31) and is electrically connected to the n$^+$-type drain region 1.

Operation of the silicon carbide semiconductor device 10 according to the embodiment is described. When voltage (forward voltage) that is positive with respect to the source electrode 11 is applied to the drain electrode 12 and a voltage at least equal to a gate threshold voltage is applied to the gate electrodes 8, a channel (n-type inversion layer) is formed in portions of the p-type base region 3, along the sidewalls (m-plane) of the trenches 6. As a result, current flows from the n$^+$-type drain region 1, through the channel and to the n$^+$-type source regions 4, whereby the MOSFET turns on. The film density of the gate insulating film 7 is increased by the post-HTO-deposition annealing performed under the later-described predetermined conditions and therefore, even when the gate insulating film 7 is formed on an m-plane, electrical characteristics and reliability of the MOSFET (the silicon carbide semiconductor device 10) may be ensured.

On the other hand, when forward voltage is applied between the source and drain, and voltage less than the gate threshold voltage is applied to the gate electrodes 8, pn junctions (main junctions) between the p$^+$-type regions 21, 22, the p-type base region 3, the n-type current spreading region 23, and the n$^-$-type drift region 2 are reverse biased, whereby the current stops flowing and the MOSFET maintains an off-state. Further, a depletion layer spreads in the p$^+$-type regions 21, 22, from the pn junctions, whereby electric field applied to the gate insulating film 7 at the bottoms of the trenches 6 is mitigated. Further, the bottoms of the trenches 6 are an Si plane or a C plane, whereby the film quality of the gate insulating film 7 is favorable at the bottoms of the trenches 6 and thus, the effect of mitigating electric field near the bottoms of the trenches 6 is high.

Figure 3:
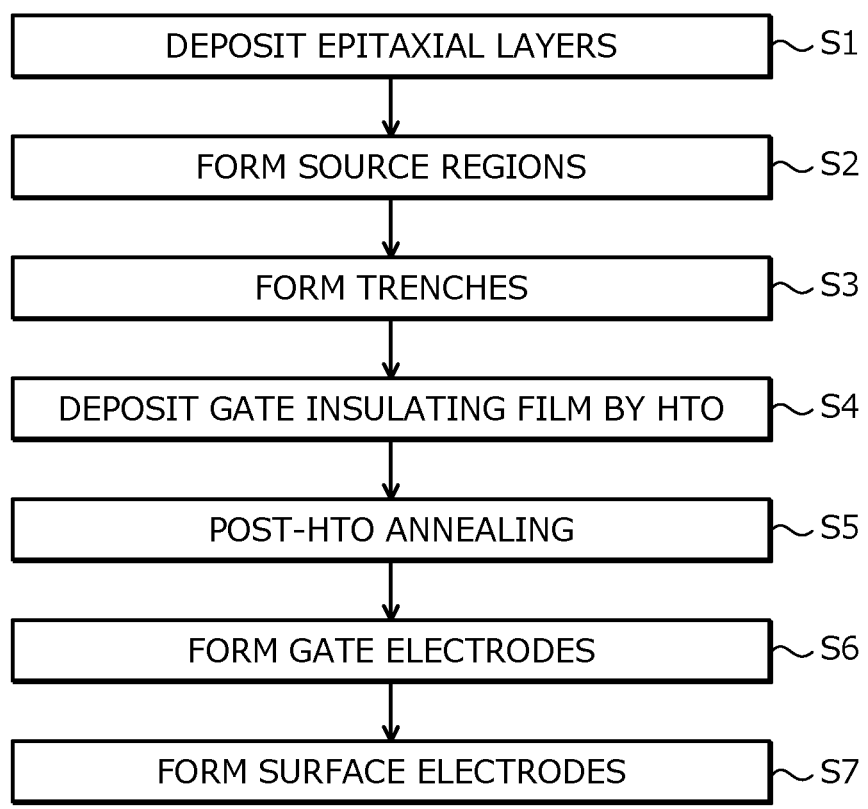
FIG. 3 is a flowchart depicting an outline of a method of manufacturing the semiconductor device according to the embodiment.

Next, a method of manufacturing the silicon carbide semiconductor device 10 according to the embodiment is described with reference to FIGS. 1 to 3. FIG. 3 is a flowchart depicting an outline of a method of manufacturing the semiconductor device according to the embodiment. First, for example, the n$^+$-type starting substrate (starting wafer) 31 containing 4H—SiC as a semiconductor material is prepared. The front surface of the n$^+$-type starting substrate 31 is an Si plane or a C plane. The n$^+$-type starting substrate 31 cleaned by RCA cleaning and thereafter, the n$^-$-type epitaxial layer 32 constituting the n$^-$-type drift region 2 is epitaxially grown (deposited) on the front surface of the n$^+$-type starting substrate 31 (step S1: part 1). The n$^-$-type epitaxial layer 32 has an impurity concentration of, for example, about $1 \times 10^{16}$/cm$^3$.

The RCA cleaning is a wet cleaning treatment in which a SC-1 cleaning and a SC-2 cleaning are performed. In the SC-1 cleaning, the semiconductor wafer is immersed and cleaned in a mixed aqueous solution containing ammonium hydroxide (NH$_4$OH), hydrogen chloride (HCl), and hydrogen peroxide (H$_2$O$_2$). In the SC-1 cleaning, organic matter and particles of the surface (contact surface in contact with the mixed aqueous solution) of the semiconductor wafer are removed. The SC-2 cleaning is performed after the SC-1 cleaning. In the SC-2 cleaning, the semiconductor wafer is immersed and cleaned in a mixed aqueous solution containing hydrogen chloride (HCl) and hydrogen peroxide (H$_2$O$_2$). In the SC-2 cleaning, metal ion contaminants of the surface of the semiconductor wafer are removed. Between the SC-1 cleaning and the SC-2 cleaning, a rinsing treatment by pure water (highly purified water: H$_2$O) is performed.

Next, by photolithography and ion implantation of a p-type impurity, in surface regions of the n$^-$-type epitaxial layer 32, the p$^+$-type regions 21 and lower portions (portions closest to the n$^+$-type drain region 1) of the p$^+$-type regions 22 are each selectively formed so as to be disposed be apart from and to repeatedly alternate one another. Further, by photolithography and ion implantation of an n-type impurity, in surface regions of the n$^-$-type epitaxial layer 32, a lower portion of the n-type current spreading region 23 is formed between each of the p$^+$-type regions 21 and an adjacent one of the p$^+$-type regions 22. A portion of the n$^-$-type epitaxial layer 32 closer to the n$^+$-type starting substrate 31 than are the p$^+$-type regions 21, 22 and the n-type current spreading region 23 constitutes the n$^-$-type drift region 2.

Next, epitaxial growth is further performed, increasing the thickness of the n$^-$-type epitaxial layer 32 to a predetermined thickness. Next, by photolithography and ion implantation of a p-type impurity, upper portions (portions closest to the n⁻-type source regions 4) of the p⁺-type regions 22 are selectively formed in the portion by which the thickness of the n⁻-type epitaxial layer 32 is increased. Further, by photolithography and ion implantation of an n-type impurity, an upper portion of the n-type current spreading region 23 is formed in the portion by which the thickness of the n⁻-type epitaxial layer 32 is increased. At positions respectively facing the lower portions of the p⁺-type regions 22 in the depth direction, the upper portions of the p⁺-type regions 22 are formed and connected to the lower portions of the p⁺-type regions 22; and at a position facing the lower portion of the n-type current spreading region 23 in the depth direction, the upper portion of the n-type current spreading region 23 is formed and connected to the lower portion of the n-type current spreading region 23.

Next, on the n⁻-type epitaxial layer 32, the p-type epitaxial layer 33 constituting the p-type base region 3 is epitaxially grown (deposited) (step S1: part 2). By the processes up to here, the semiconductor substrate (semiconductor wafer) 30 in which the epitaxial layers 32, 33 are sequentially stacked on the front surface of the n⁺-type starting substrate 31 is fabricated (manufactured). Next, photolithography and ion implantation are repeatedly performed under different conditions, whereby the n⁺-type source regions 4 and the p⁺⁺-type contact regions 5 are selectively formed in surface regions of the p-type epitaxial layer 33 (step S2). A portion of the p-type epitaxial layer 33 closer to the n⁻-type epitaxial layer 32 than are the n⁺-type source regions 4 and the p⁺⁺-type contact regions 5 constitutes the p-type base region 3.

Next, for all the diffused regions (the p⁺-type regions 21, 22, the n-type current spreading region 23, the n⁺-type source regions 4, and the p⁺⁺-type contact regions 5) formed by ion implantation, a heat treatment for activating the impurities is performed. The heat treatment for activating the impurities may be performed each time diffused regions are formed by ion implantation. Next, the trenches 6 that penetrate through the n⁺-type source regions 4 and the p-type base region 3 in the depth direction from the front surface of the semiconductor substrate 30 (surface of the p-type epitaxial layer 33) and reach the n-type current spreading region 23 are formed by photolithography and etching (step S3: first process). At the bottoms of the trenches 6, a crystal plane (Si plane or C plane) identical to that of the front surface of the semiconductor substrate 30 appears while the sidewalls of the trenches 6 are m-planes.

Next, after the RCA cleaning, a $SiO_2$ film (HTO film) constituting the gate insulating film 7 is deposited by a HTO process to have the predetermined thickness t1 (step S4: second process). In the process at step S4, the thickness of HTO film deposited as the gate insulating film 7 is greatest at portions on the front surface of the semiconductor substrate 30 and becomes progressively thinner along the inner walls of the trenches 6 with increasing proximity to the bottoms of the trenches 6. Further, the portion within the range t11 of 3 nm from the $SiC/SiO_2$ interface 20 at the initial stage of deposition of the gate insulating film 7 constitutes the low-density film 7a having a relatively low film density. The gate insulating film 7 is further constituted by the high-density film 7b that is deposited on the low-density film 7a, is a portion that is at least 3 nm apart from the $SiC/SiO_2$ interface 20, and has a relatively high film density.

Next, under a mixed gas atmosphere containing nitric oxide (NO), nitrogen ($N_2$), and oxygen ($O_2$), a heat treatment (post-HTO-deposition annealing: post-HTO annealing) is performed at a temperature in a range of, for example, about 1250 degrees C. to 1300 degrees C. (step S5: third process). Under the conditions described above, the post-HTO-deposition annealing at step S5 is performed, whereby compared to an instance in which a post-HTO-deposition annealing is performed under the conventional conditions (mixed gas atmosphere containing only nitric oxide and nitrogen), the baking process of the gate insulating film 7 progresses, and the overall film density of the gate insulating film 7 increases and may be set to be within the predetermined range described above. Further, the film density of the gate insulating film 7 on the m-plane where the film density is relatively low may be set to be closer to the film density of the gate insulating film 7 on other crystal planes.

In the post-HTO-deposition annealing at step S5, a total oxygen ($O_2$) amount (total flow amount of oxygen molecules generated by oxygen atoms in the nitric oxide and oxygen molecules in the oxygen gas introduced into the furnace) of the mixed gas atmosphere containing nitric oxide, nitrogen, and oxygen, for example, suffices to be at most about 5%. The total oxygen flow amount of the mixed gas atmosphere containing nitric oxide, nitrogen, and oxygen is set to be, for example, at most about 5% and partial pressure of the oxygen of the mixed gas atmosphere is made as low as possible, whereby the oxygen atoms are caused to reach the $SiC/SiO_2$ interface 20 and the baking of the gate insulating film 7 overall is advanced while post-oxidation of SiC of the $SiC/SiO_2$ interface 20 (the epitaxial layers 32, 33 constituting inner wall surfaces of the trenches 6) may be suppressed.

Further, by the post-HTO-deposition annealing at step S5, the nitrogen concentration (nitrogen atom concentration) of nitrogen atoms accumulated at the $SiC/SiO_2$ interface 20 is maintained at substantially the same level as that in an instance in which post-HTO-deposition annealing is performed under the conventional conditions and the nitrogen concentration (nitrogen atom concentration) in the gate insulating film 7 may be reduced to a greater extent than in an instance in which post-HTO-deposition annealing is performed under the conventional conditions. The nitrogen concentration of the $SiC/SiO_2$ interface 20 is maintained, whereby channel mobility may be increased to about the same extent as that for post-HTO-deposition annealing under the conventional conditions. The nitrogen concentration in the gate insulating film 7 is lower than in an instance of post-HTO-deposition annealing under the conventional conditions, whereby the gate threshold voltage may be reduced and variation of the gate threshold voltage may be suppressed, thereby stabilizing the gate threshold voltage.

The higher is the temperature of the post-HTO-deposition annealing at step S5, the higher is the film density of the gate insulating film 7, nonetheless, when the temperature of the post-HTO-deposition annealing at step S5 exceeds 1300 degrees C., the post-oxidation of SiC at the $SiC/SiO_2$ interface 20 progresses too much. Further, even when the temperature of the post-HTO-deposition annealing at step S5 moves away from a suitable value by being is too high or too low, the nitrogen concentration of the $SiC/SiO_2$ interface 20 is a suitable value of about 1300 degrees C. When the temperature of the post-HTO-deposition annealing at step S5 is in a range of about 1250 degrees C. to 1300 degrees C., the film density of the gate insulating film 7 is relatively high and the post-oxidation of SiC at the $SiC/SiO_2$ interface 20 is suppressed, and the nitrogen concentration of the $SiC/SiO_2$ interface 20 may be close to a suitable value.

In particular, for example, under a mixed gas atmosphere containing nitric oxide, nitrogen, and oxygen at rates of 6%, 92%, and 2%, respectively, the post-HTO-deposition annealing is performed at a temperature of at least 1250 degrees C. More specifically, for example, in a furnace that has been vacuum-exhausted, nitric oxide gas, nitrogen gas, and oxygen gas are introduced at respective flow amounts of 0.3 slm, 4.6 slm, and 0.1 slm, the temperature is increased, and the semiconductor substrate 30 is placed in the furnace that has been heated to a temperature of about 700 degrees C. Subsequently, nitrogen gas of 5 slm is further introduced into the furnace, the total oxygen flow amount of the mixed gas atmosphere containing nitric oxide, nitrogen, and oxygen is set to be at most 5%, the temperature of the furnace is increased to about 1300 degrees C., and the post-HTO-deposition annealing is performed for about 30 minutes.

Next, a polysilicon (poly-Si) layer is deposited on the front surface of the semiconductor substrate 30 so as to be embedded in the trenches 6. Subsequently, the polysilicon layer, for example, is etched and left only inside the trenches 6, thereby forming the gate electrodes 8 (step S6: fourth process). Next, on the front surface of the semiconductor substrate 30, the insulating film 9 is formed covering the gate electrodes 8. Next, by a general method, surface electrodes constituting the source electrode 11 and the drain electrode 12 are formed on the front surface and the back surface of the semiconductor substrate 30, respectively (step S7). Thereafter, the semiconductor wafer (the semiconductor substrate 30) is diced (cut) into individual chips, whereby the silicon carbide semiconductor device 10 depicted in FIGS. 1 and 2 is completed.

As described above, according to the embodiment, the $SiO_2$ film (HTO film) constituting the gate insulating film is deposited by the HTO process, whereby SiC at the inner wall surfaces of the trenches (epitaxial layers constituting inner wall surfaces of the trenches) is resistant to oxidation, and compared to an instance in which the $SiO_2$ film (thermal oxide film) constituting the gate insulating film is formed by thermal oxidation, the occurrence of excess carbon due to the thermal oxidation reaction of SiC is inhibited. Thus, adverse effects (increases of the interface state, defects in the gate insulating film, etc.) on interface characteristics of the $SiC/SiO_2$ interface may be suppressed and degradation of device element characteristics may be suppressed.

Further, according to the embodiment, after the gate insulating film is deposited by the HTO process, under the mixed gas atmosphere containing nitric oxide, nitrogen, and oxygen, for example, the post-HTO-deposition annealing is performed at a temperature in a range of 1250 degrees C. to 1300 degrees C. As a result, compared to an instance in which post-HTO-deposition annealing is performed under the conventional conditions (mixed gas atmosphere containing only nitric oxide and nitrogen) mainly targeting improvement of channel mobility, the film density of the gate insulating film may be increased, whereby the film quality of the gate insulating film is enhanced and the insulating performance of the gate insulating film may be increased. As a result, leak current may be reduced. Further, capability of the gate insulating film to resist dielectric breakdown may be enhanced.

Further, according to the embodiment, the film quality of the gate insulating film is enhanced, whereby the thickness of the gate insulating film may be reduced. Thus, the thickness of the gate insulating film is reduced, enabling reduction of the voltage applied to the gate electrodes and enhancement of the capability of the gate insulating film to resist dielectric breakdown over time. As a result, the lifespan of the device may be increased, thereby enhancing reliability. Further, according to the embodiment, the total oxygen flow amount of the mixed gas atmosphere for the post-HTO-deposition annealing is set to 5% at most, whereby the post-oxidation of SiC at the $SiC/SiO_2$ interface is suppressed and adverse effects to the interface characteristics of the $SiC/SiO_2$ interface due to excess carbon are further suppressed.

Further, according to the embodiment, the post-HTO-deposition annealing is performed under the predetermined conditions described above, whereby a nitrogen concentration of the $SiC/SiO_2$ interface is maintained at substantially the same level as that in an instance in which post-HTO-deposition annealing is performed under the conventional conditions and the nitrogen concentration in the gate insulating film may be reduced compared to the instance in which post-HTO-deposition annealing is performed under the conventional conditions. Therefore, electrical characteristics (channel mobility, etc.) of substantially the same level as those in an instance in which post-HTO-deposition annealing is performed under the conventional conditions are obtained, the gate threshold voltage may be reduced compared to the instance in which post-HTO-deposition annealing is performed under the conventional conditions, and variation of the gate threshold voltage may be suppressed, stabilizing the gate threshold voltage.

The film density of the HTO film ($SiO_2$ film deposited by HTO process) was verified. FIG. 4 is a table depicting a relationship between the thickness and the film density of the HTO film in experimental examples. FIG. 5 is a table depicting a relationship between the film density and the distance from the $SiC/SiO_2$ interface of the HTO film in the experimental examples. FIGS. 4 and 5 show XRR measurement values (measurement error ±0.03 $g/cm^3$) of the film density of a HTO film for which the post-HTO-deposition annealing at step S5 described above (refer to FIG. 3) is not performed.

As the experimental examples, multiple flat-plate shaped samples were prepared in which a $SiO_2$ film (HTO film) was deposited by a general HTO process on a main surface of an epitaxial substrate containing SiC. In particular, as the experimental examples, two each of three types of samples (total of 6 samples) having differing crystal planes (Si plane, C plane, and m-plane) for a main surface (SiC surface where the HTO film is deposited) of the epitaxial substrate were prepared by changing the thickness of the HTO film (26 nm, 53 nm).

More specifically, the samples of the experimental examples were fabricated using epitaxial substrates in which an $n^-$-type epitaxial layer having a concentration of $1 \times 10^{16}/cm^3$ and a thickness of 5 μm was epitaxially grown on a main surface of a starting substrate containing SiC and having any one of an Si plane, a C plane, and an m-plane as a main surface (hereinafter, respectively, an Si-plane substrate, a C-plane substrate, and an the m-plane substrate). The Si-plane substrate, the C-plane substrate, and the m-plane substrate were cleaned by the RCA cleaning before the $n^-$-type epitaxial layer were epitaxially grown.

Surfaces (i.e., Si plane, C plane) of the $n^-$-type epitaxial layer of the samples fabricated using the Si-plane substrate and the C-plane substrate correspond to the bottoms of the trenches 6 of the silicon carbide semiconductor device 10 according to the embodiment described above. The surface (i.e., m-plane) of the $n^-$-type epitaxial layer of the samples fabricated using the m-plane substrates correspond to the sidewalls of the trenches 6 of the silicon carbide semiconductor device 10 according to the embodiment described above.

The samples of the experimental examples were fabricated by performing the RCA cleaning on the epitaxial substrates fabricated using the Si-plane substrates, the C-plane substrates, and the m-plane substrates and thereafter, depositing a HTO film ($SiO_2$ film by the HTO process) having a predetermined thickness (26 nm or 53 nm), by chemical vapor deposition (CVD) on the surface (i.e., Si plane, C plane, m-plane) of the $n^-$-type epitaxial layer.

For the HTO films of the samples of the experimental examples, results of XRR measurement of the film density of an area at least 3 nm apart from the interface between the $n^-$-type epitaxial layer and the HTO film ($SiC/SiO_2$ interface) are depicted in FIG. 4. From the results depicted in FIG. 4, it was confirmed that the film density of the HTO film differed depending on the crystal plane on which the HTO film was deposited and was lower for the m-plane compared to the Si plane and the C plane. Further, it was confirmed that for the HTO film, the greater the thickness thereof is, the higher the film density thereof is.

Therefore, the film quality of the gate insulating film 7 differs depending on the crystal plane of the SiC on which the gate electrodes 8 are formed, and therefore, the film density of the gate insulating film 7 may be set as high as possible to enhance the film quality of the gate insulating film 7. For example, in the trench gate structure, electric field concentrates near the bottoms of the trenches 6 and therefore, the bottoms of the trenches 6 may be set as the Si plane or the C plane to increase the film density of the gate insulating film 7 at the bottoms of the trenches 6.

Further, in an instance in which the bottoms of the trenches 6 are set as the Si plane or the C plane, the sidewalls of the trenches 6 are the m-plane and therefore, in particular, the film density of the gate insulating film 7 has to be increased. The film density of the gate insulating film 7 may be increased by the post-HTO-deposition annealing at step S5 described above and therefore, the present embodiment is suitable for a trench gate structure. Further, the film density of the gate insulating film 7 is increased and the film quality of the gate insulating film 7 is enhanced, whereby the thickness of the gate insulating film 7 may be reduced.

For the samples of the experimental examples for which the thickness of the HTO film was set to 53 nm, results of measurement of the film density for a portion of the HTO film within a range of 3 nm from the $SiC/SiO_2$ interface and a portion at least 3 nm apart from the $SIC/SiO_2$ interface are depicted in FIG. 5. From the results depicted in FIG. 5, it was confirmed that the film density of the HTO film was lower for the portion within at least 3 nm from the $SIC/SiO_2$ interface, compared to the portion at least 3 nm apart from the $SiC/SiO_2$ interface.

Figure 7:
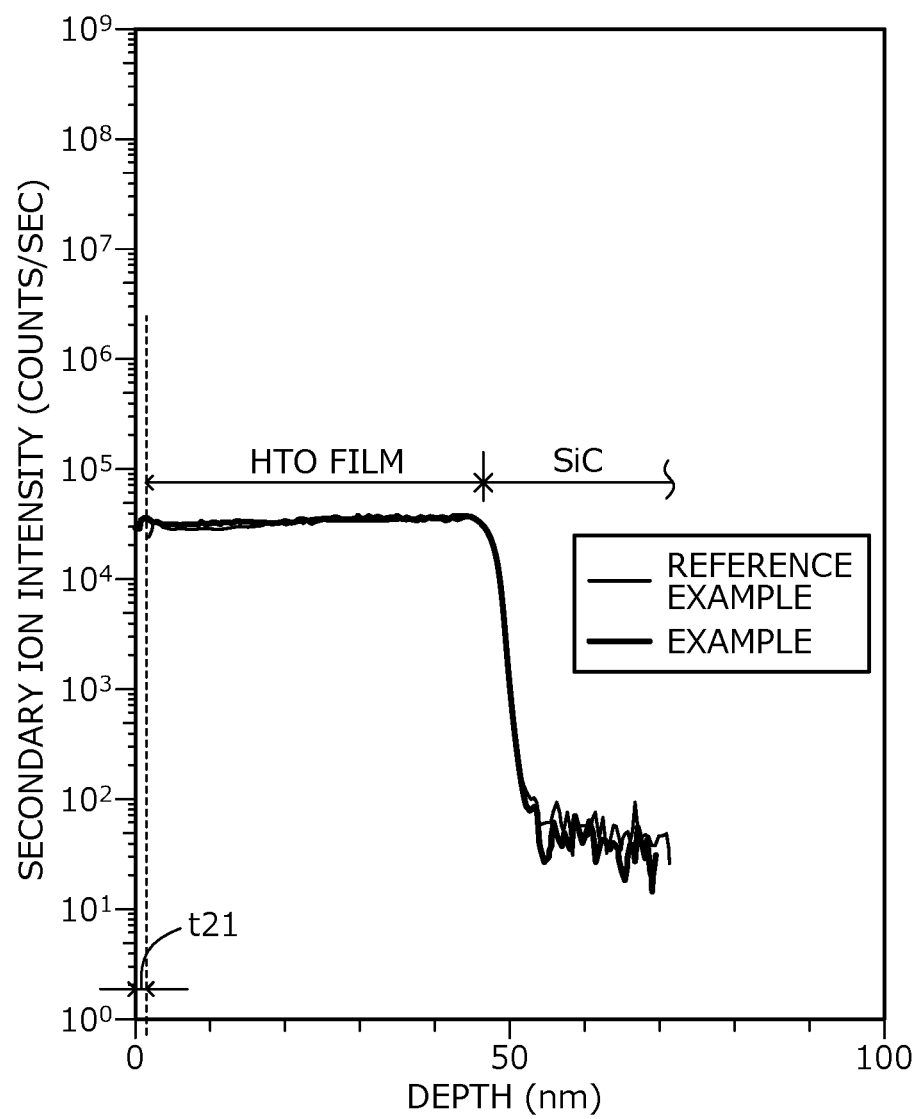
FIG. 7 is a characteristics diagram depicting secondary ion intensity distribution in a HTO film of an example.

Conditions of the post-HTO-deposition annealing at step S5 of the method of manufacturing the silicon carbide semiconductor device 10 according to the embodiment (refer to FIG. 3) described above were verified. FIG. 6 is a table depicting a relationship between the film density of the HTO film and the post-HTO-deposition annealing conditions. FIG. 7 is a characteristics diagram depicting secondary ion intensity distribution in the HTO film of the example. FIG. 8 is a characteristics diagram depicting nitrogen concentration distribution in the HTO film and the $SiC/SiO_2$ interface of the example.

Of the samples of the experimental examples described above, the sample in which the HTO film having the thickness of 53 nm is deposited on the m-plane (sample on the last line in FIG. 5) was prepared in plural and the post-HTO-deposition annealing was performed under different conditions (hereinafter, the example, the conventional example, and a comparison example). For the HTO films of the samples for which the post-HTO-deposition annealing was performed, the results of measurement of the film density by the XRR method (measurement error ±0.03 $g/cm^3$), for portions at least 3 nm apart from the interface between the $n^-$-type epitaxial layer and the HTO film ($SiC/SiO_2$ interface) are depicted in FIG. 6.

For the example, the post-HTO-deposition annealing was performed according to the conditions of the post-HTO-deposition annealing at step S5, for about 30 minutes at a temperature of 1300 degrees C. under the mixed gas atmosphere containing nitric oxide, nitrogen, and oxygen at rates of 6%, 92%, and 2%, respectively. For the conventional example, the gas atmosphere of the post-HTO-deposition annealing was a mixed gas atmosphere containing nitric oxide and nitrogen at rates of 10% (flow amount of 0.5 slm) and 90% (flow amount of 4.5 slm), respectively.

For the comparison example, the gas atmosphere of the post-HTO-deposition annealing was a mixed gas atmosphere containing nitrogen and oxygen at rates of 95% and 5%, respectively. The temperature and the time of the post-HTO-deposition annealing for the conventional example and the comparison example were the same as those for the example. For the example (sample on last line in FIG. 5, hereinafter, reference example), FIG. 6 further shows results of measurement of the film density for a portion of the HTO film at least 3 nm apart from the $SiC/SiO_2$ interface, before the post-HTO-deposition annealing is performed.

From the results shown in FIG. 6, it was confirmed that compared to the reference example for which the post-HTO-deposition annealing was not performed, the film density of the HTO film could be increased by performing the post-HTO-deposition annealing like that for the example, the conventional example, and the comparison example Further, it was confirmed that the film density of the HTO film could be increased more in the example than in the conventional example. The HTO film of the example corresponds to the gate insulating film 7 in FIG. 1. It was confirmed that the film density of the HTO film in the comparison example was about that same as that in the conventional example.

In the example, the conventional example, and the comparison example, the total oxygen flow amount of the mixed gas atmosphere during the post-HTO-deposition annealing was the same at 5%. Therefore, it was confirmed that to contribute to enhancement of the film density of the HTO film, introduction of nitric oxide gas, nitrogen gas, and oxygen gas and generation of the mixed gas atmosphere like that for the post-HTO-deposition annealing of the example is necessary, not adjustment of the total oxygen flow amount of the mixed gas atmosphere during the post-HTO-deposition annealing.

Nonetheless, partial pressure of the oxygen in the mixed gas atmosphere during the post-HTO-deposition annealing may be set as low as possible to suppress the post-oxidation of the SiC (the $n^-$-type epitaxial layer) at the $SiC/SiO_2$ interface. For example, it was confirmed by the inventor that while the total oxygen flow amount of the mixed gas atmosphere during the post-HTO-deposition annealing for both the example and the conventional example was the same at 5%, in the conventional example, the thickness of the SiC at the $SiC/SiO_2$ interface was about 4 nm and was subject to post-oxidation (not depicted).

On the other hand, it was confirmed that in the example, even though the total oxygen flow amount in the mixed gas atmosphere was the same as that in the conventional example, a thickness t21 of the post-oxidation of the SiC at the SiC/SiO$_2$ interface (corresponds to the SiC/SiO$_2$ interface 20 in FIG. 1) could be set to about 2 nm or less, which is thinner than that in the conventional example (refer to later-described FIG. 7). Therefore, even at the maximum, the total oxygen flow amount of the mixed gas atmosphere for the post-HTO-deposition annealing at step S5 may be set to about 5%, which is the same as the total oxygen flow amount of the post-HTO-deposition annealing in the conventional example.

Results of simulation of secondary ion intensity distribution in the HTO film of the example and the reference example by secondary ion mass spectrometry (SIMS) are shown in FIG. 7. From the results shown in FIG. 7, it was confirmed that in the example, the SiC at the SiC/SiO$_2$ interface where the thickness t21 was about 2 nm or less was subject to post-oxidation and the thickness of the SiO$_2$ film (corresponds to the thickness t1 of the gate insulating film 7 in FIG. 1) was greater than that in the reference example.

In the non-depicted conventional example, the SiC at the SiC/SiO$_2$ interface where the thickness was about 4 nm was subject to post-oxidation. Thus, it was confirmed that in the example, post-oxidation of the SiC during the post-HTO-deposition annealing could be suppressed. In FIG. 7, the interface between the n$^-$-type epitaxial layer and the HTO film (SiC/SiO$_2$ interface) is regarded as a reference and therefore, on the horizontal axis in FIG. 7, the depth=0 nm corresponds to the surface of HTO film in the example while the surface of the HTO film in the reference example is positioned at a depth=t21 on the horizontal axis in FIG. 7.

Further, it was confirmed that in the example, the SiC at the SiC/SiO$_2$ interface is subject to post-oxidation, whereby during the post-HTO-deposition annealing, oxygen atoms may be caused to reach a vicinity of the SiC/SiO$_2$, thereby enabling baking of the HTO film to be advanced overall. Thus, it was confirmed that the post-HTO-deposition annealing at step S5 has an effect of suppressing post-oxidation of SiC and an effect of enhancing the film density of the HTO film near the SiC/SiO$_2$ interface.

Figure 8:
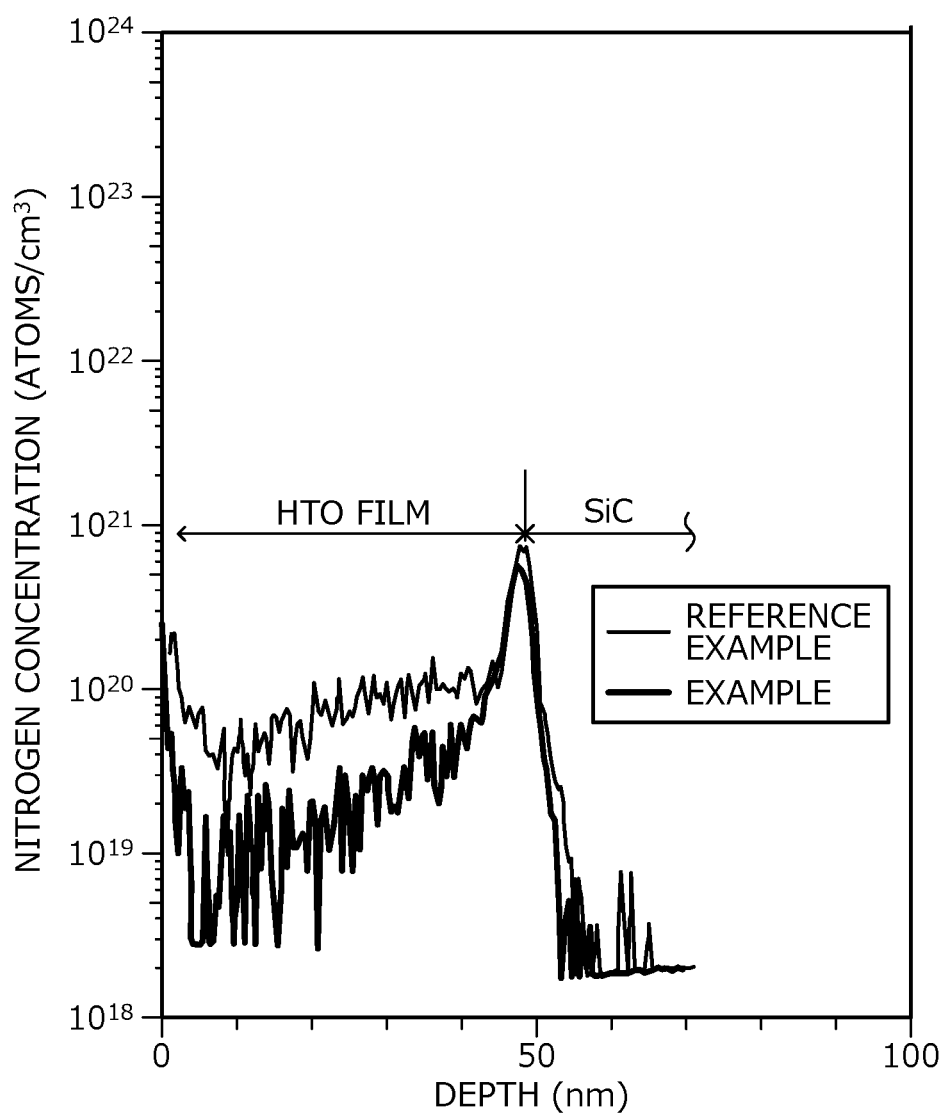
FIG. 8 is a characteristics diagram depicting nitrogen concentration distribution in the HTO film and a $SiC/SiO_2$ interface of the example.

Results of simulation of a nitrogen concentration distribution in the HTO film and at the SiC/SiO$_2$ interface in the example and the conventional example by SIMS are shown in FIG. 8. From the results shown in FIG. 8, it was confirmed that in the example, the nitrogen concentration of the SiC/SiO$_2$ interface is maintained at substantially the same level as that in the conventional example. Thus, it was confirmed that due to the post-HTO-deposition annealing at step S5, the film density of the gate insulating film 7 could be enhanced without adversely affecting the electrical characteristics.

Further, from the results shown in FIG. 8, it was confirmed that in the example, the nitrogen concentration in the HTO film could be reduced more than in the conventional example. Thus, it was confirmed that the post-HTO-deposition annealing at step S5 has a further effect of reducing the nitrogen concentration in the gate insulating film 7. As a result, the gate threshold voltage may be reduced more than in the conventional example and variation of the gate threshold voltage may be suppressed, stabilizing the gate threshold voltage.

In the foregoing, the present invention is not limited to the embodiments described above and various modifications within a range not departing from the spirit of the invention are possible. For example, instead of a vertical MOSFET, the present invention is applicable to a vertical insulated gate bipolar transistor (IGBT), a vertical SJ-MOSFET, etc. to which a trench gate structure may be adopted. A SJ-MOSFET is a MOSFET with a super junction (SJ) structure having, as a drift layer, a parallel pn layer in which p-type regions and n-type regions with an increased impurity concentration are disposed to be adjacent to and repeatedly alternate one another in a direction parallel to the front surface of the semiconductor substrate.

According to the invention described above, the film density (density) of the gate insulating film may be increased and therefore, the film quality of the gate insulating film is enhanced and the insulating performance of gate insulating film may be increased. As a result, leak current characteristics, the capability to resist dielectric breakdown, etc. may be enhanced. Further, the film quality of the gate insulating film is enhanced, whereby the thickness of the gate insulating film may be reduced and the voltage applied to the gate electrodes may be reduced, thereby enabling enhancement of the capability to resist dielectric breakdown over time.

Further, according to the invention described above, electrical characteristics (channel mobility, etc.) of substantially the same level as that in an instance in which post-HTO-deposition annealing is performed under the conventional conditions (mixed gas atmosphere containing only nitric oxide and nitrogen) may be realized. Further, the gate threshold voltage and variation of the gate threshold voltage may be reduced and the gate threshold voltage may be stabilized compared to an instance in which post-HTO-deposition annealing is performed under the conventional conditions.

The silicon carbide semiconductor device and the method of manufacturing a silicon carbide semiconductor device according to the present invention achieve an effect in that reliability may be enhanced.

As described above, the silicon carbide semiconductor device and the method of manufacturing a silicon carbide semiconductor device according to the present invention are useful for power semiconductor devices used in power converting equipment, power source devices such those in various types of industrial machines, etc., and are particularly suitable for device element structures in which a gate insulating film is provided on an m-plane where the film density of the gate insulating film is relatively lower (for example, a trench gate structure in which a channel is formed along an m-plane).

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A silicon carbide semiconductor device having an insulated gate with a three-layer structure including a gate, an oxide film, and a semiconductor, the silicon carbide semiconductor device comprising:
   a semiconductor substrate containing silicon carbide and constituting the semiconductor, the semiconductor substrate having a main surface;
   a trench extending a predetermined depth from the main surface of the semiconductor substrate, in a direction orthogonal to the main surface of the semiconductor substrate, the trench having an inner wall that includes a sidewall and a bottom of the trench;
   a gate insulating film constituting the oxide film, provided along the inner wall of the trench so as to be in contact with the semiconductor substrate at the inner wall of the trench; and a gate electrode constituting the gate, provided so as to be in contact with the gate insulating film in the trench, wherein a trench gate structure is formed in which a channel is formed in a portion of the semiconductor substrate along the sidewall of the trench when the silicon carbide semiconductor device is on, the main surface of the semiconductor substrate is an Si plane, the sidewall of the trench is an m-plane, the gate insulating film is a silicon oxide film having a thickness in a range of 50 nm to 80 nm, and consisting of a high-temperature oxidation film, the gate insulating film has a film density that is in a range of 2.21 g/cm$^3$ to 2.38 g/cm$^3$, and has a bottom portion disposed at the bottom of the trench and a sidewall portion disposed at the sidewall of the trench, a film density of the bottom portion being higher than a film density of the sidewall portion, and the gate insulating film has a two-layer structure including:

a low-density film in contact with the semiconductor substrate at the inner wall of the trench, the low-density film being within a range of 3 nm from an interface between the semiconductor substrate and the gate insulating film, and a high-density film in contact with the low-density film and the gate electrode, the high-density film being at least 3 nm apart from the interface between the semiconductor substrate and the gate insulating film, the high-density film having a film density that is higher than a film density of the low-density film.

2. The silicon carbide semiconductor device according to claim 1, wherein the film density of the gate insulating film is at least 2.27 g/cm$^3$ within a plane of the sidewall of the trench.

3. The silicon carbide semiconductor device according to claim 1, wherein a nitrogen concentration of an interface between the semiconductor substrate and the gate insulating film is at least 5×10$^{20}$ atoms/cm$^3$.

4. The silicon carbide semiconductor device according to claim 1, wherein an average nitrogen concentration of the gate insulating film in a thickness direction, from an interface between the semiconductor substrate and the gate insulating film to a contact surface of the gate insulating film is at most 5×10$^{19}$ atoms/cm$^3$, the contact surface being in contact with the gate electrode.

5. The silicon carbide semiconductor device according to claim 1, wherein the bottom portion of the gate insulating film is thinner than the sidewall portion of the gate insulating film.

6. The silicon carbide semiconductor device according to claim 1, wherein the gate electrode is directly in contact with the high-temperature oxidation film.

7. The silicon carbide semiconductor device according to claim 1, wherein the gate insulating film is in direct contact with both the semiconductor substrate at the inner wall of the trench and the gate electrode.

8. The silicon carbide semiconductor device according to claim 1, wherein the film density of the high-density film of the bottom portion disposed at the bottom of the trench is equal to or higher than 2.29 g/cm$^3$.

9. The silicon carbide semiconductor device according to claim 1, wherein a peak nitrogen concentration of the gate insulating film is less than 1×10$^{21}$ cm$^{-3}$.

10. A method of manufacturing a silicon carbide semiconductor device having an insulated gate with a three-layer structure including a gate, an oxide film, and a semiconductor, the method comprising:

preparing a semiconductor substrate that contains silicon carbide and constitutes the semiconductor, and forming in the semiconductor substrate, a trench that extends a predetermined depth from a main surface of the semiconductor substrate, in a direction orthogonal to the main surface of the semiconductor substrate, the trench having an inner wall that includes a sidewall and a bottom;

forming a gate insulating film constituting the oxide film, along the inner wall of the trench so as to be in contact with the semiconductor substrate at the inner wall of the trench;

performing a heat treatment to thereby bake the gate insulating film; and forming a gate electrode constituting the gate, so as to be in contact with the gate insulating film in the trench after performing the heat treatment and thereby forming a trench gate structure in which a channel is formed in a portion of the semiconductor substrate along the sidewall of the trench when the silicon carbide semiconductor device is on, wherein the main surface of the semiconductor substrate is an Si plane, the sidewall of the trench is an m-plane, forming the gate insulating film includes thermally oxidating the inner wall of the trench to form a high-temperature oxidation film as the gate insulating film, the high-temperature oxidation film having a thickness in a range of 50 nm to 80 nm, and baking the gate insulating film includes performing the heat treatment under a mixed gas atmosphere containing nitric oxide, nitrogen, and oxygen, at a temperature in a range of 1250 degrees C. to 1300 degrees C., and at the performing the heat treatment, the gate insulating film is formed so as to have a two-layer structure including:

a low-density film in contact with the semiconductor substrate at the inner wall of the trench, the low-density film being within a range of 3 nm from an interface between the semiconductor substrate and the gate insulating film, and a high-density film in contact with the low-density film and the gate electrode, the high-density film being at least 3 nm apart from the interface between the semiconductor substrate and the gate insulating film, the high-density film having a film density that is higher than a film density of the low-density film.

11. The method according to claim 10, wherein the mixed gas atmosphere has a total oxygen flow amount of 5% or less.

12. The method according to claim 10, wherein the film density of the high-density film of the bottom portion disposed at the bottom of the trench is equal to or higher than 2.29 g/cm$^3$.

* * * * *